US009818743B2

(12) United States Patent
Kelkar et al.

(10) Patent No.: US 9,818,743 B2
(45) Date of Patent: Nov. 14, 2017

(54) POWER SEMICONDUCTOR DEVICE WITH CONTIGUOUS GATE TRENCHES AND OFFSET SOURCE TRENCHES

(71) Applicant: Infineon Technologies Americas Corp., El Segundo, CA (US)

(72) Inventors: Kapil Kelkar, Torrance, CA (US); Timothy D. Henson, Torrance, CA (US); Ling Ma, Redondo Beach, CA (US); Hugo Burke, Liantrisant (GB); Niraj Ranjan, El Segundo, CA (US); Alain Charles, Compiegne (FR)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 64 days.

(21) Appl. No.: 14/300,097

(22) Filed: Jun. 9, 2014

(65) Prior Publication Data

US 2014/0374825 A1     Dec. 25, 2014

Related U.S. Application Data

(60) Provisional application No. 61/837,826, filed on Jun. 21, 2013.

(51) Int. Cl.
*H01L 29/78* (2006.01)
*H01L 27/088* (2006.01)
(Continued)

(52) U.S. Cl.
CPC .......... *H01L 27/088* (2013.01); *H01L 29/404* (2013.01); *H01L 29/407* (2013.01);
(Continued)

(58) Field of Classification Search
CPC .......... H01L 29/4236; H01L 29/66068; H01L 29/7811; H01L 29/045; H01L 29/0634; H01L 29/456; H01L 29/0878; H01L 29/7802; H01L 29/7827; H01L 29/0623; H01L 29/7395; H01L 29/7813; H01L 29/1095; H01L 29/0696; H01L 29/41766; H01L 29/66734; H01L 29/407; H01L 29/42368; H01L 29/1608; H01L 29/4238;
(Continued)

(56) References Cited

U.S. PATENT DOCUMENTS 5,973,360 A * 10/1999 Tihanyi ............... H01L 29/0653
257/330
6,040,609 A * 3/2000 Frisina ............ H01L 21/823412
257/153

(Continued)

*Primary Examiner* — Eric Ward
(74) *Attorney, Agent, or Firm* — Slater Matsil, LLP

(57) ABSTRACT

Disclosed is a power semiconductor device that includes a plurality of source trenches and adjacent source regions. The plurality of source trenches extend from a top surface of a semiconductor substrate into the semiconductor substrate. The power semiconductor device further includes a plurality of gate trenches that extend from the top of the semiconductor substrate into the semiconductor substrate, and are arranged in hexagonal or zigzag patterns. A contiguous formation is created by the plurality of gate trenches, and the plurality of gate trenches separate the plurality of source trenches from one another.

16 Claims, 5 Drawing Sheets

(51) Int. Cl.
  *H01L 29/40* (2006.01)
  *H01L 29/423* (2006.01)
  *H01L 29/861* (2006.01)
  *H01L 29/06* (2006.01)
  *H01L 29/10* (2006.01)

(52) U.S. Cl.
  CPC ...... *H01L 29/4238* (2013.01); *H01L 29/7813* (2013.01); *H01L 29/8613* (2013.01); *H01L 29/0696* (2013.01); *H01L 29/1095* (2013.01)

(58) Field of Classification Search
  CPC ........... H01L 29/7397; H01L 29/66727; H01L 29/861–29/885
  See application file for complete search history.

(56) References Cited

U.S. PATENT DOCUMENTS

| | | | |
|---|---|---|---|
| 6,710,403 B2* | 3/2004 | Sapp | H01L 29/7813 257/228 |
| 6,750,508 B2 | 6/2004 | Omura | |
| 7,592,650 B2* | 9/2009 | Hshieh | H01L 24/26 257/123 |
| 8,072,027 B2 | 12/2011 | Kim | |
| 8,330,213 B2* | 12/2012 | Darwish | H01L 29/407 257/330 |
| 2005/0073030 A1* | 4/2005 | Inoue | H01L 29/861 257/656 |
| 2006/0060916 A1* | 3/2006 | Girdhar | H01L 29/407 257/330 |
| 2006/0214197 A1* | 9/2006 | Nakamura | H01L 29/4236 257/288 |
| 2007/0108511 A1* | 5/2007 | Hirler | H01L 29/407 257/328 |
| 2010/0181641 A1* | 7/2010 | Blank | H01L 29/7813 257/520 |
| 2012/0061753 A1* | 3/2012 | Nishiwaki | H01L 29/407 257/331 |
| 2012/0119305 A1* | 5/2012 | Chen | H01L 29/4238 257/401 |
| 2013/0009256 A1* | 1/2013 | Okumura | H01L 21/0465 257/402 |
| 2013/0105886 A1* | 5/2013 | Lui | H01L 29/407 257/330 |
| 2014/0054645 A1* | 2/2014 | Saito | H01L 29/0696 257/139 |
| 2014/0138737 A1* | 5/2014 | Bobde | H01L 29/402 257/140 |

* cited by examiner

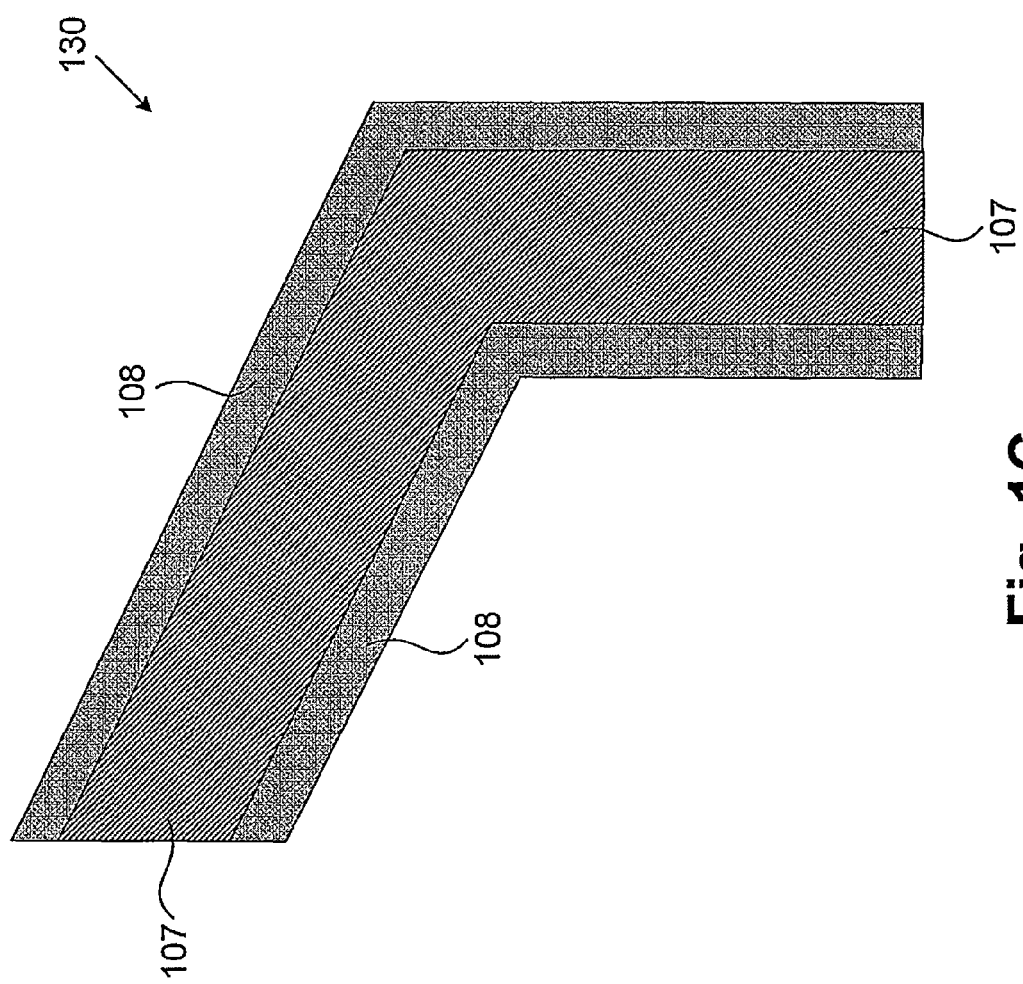

POWER SEMICONDUCTOR DEVICE WITH CONTIGUOUS GATE TRENCHES AND OFFSET SOURCE TRENCHES

The present application claims the benefit of and priority to U.S. Provisional Patent Application Ser. No. 61/837,826, filed on Jun. 21, 2013, and entitled "Semiconductor Devices Having a Cellular Layout of Shield Electrodes." The disclosure of this provisional application is hereby incorporated fully by reference into the present application.

BACKGROUND

Power semiconductor devices, such as metal-oxide semiconductor field-effect transistors (MOSFETs), are widely used in a variety of electronic devices and systems. Examples of these devices and systems include switches, DC to DC converters, and power supplies. In power devices, optimizing performance characteristics such as breakdown voltage, ON resistance ($R_{dson}$), semiconductor substrate utilization, and output capacitance are increasingly important. For example, it is desirable to lower $R_{dson}$, increase breakdown voltage, optimize use of the active region of the semiconductor substrate, and decrease output capacitance, particularly using methods that do not add to the thermal budget for fabrication of semiconductor devices.

In conventional methods, the layout of the trenches in the semiconductor device consumes a large percentage of the active area of the semiconductor substrate, and as a result decreases the performance characteristics of the semiconductor device. As such, there is a need for a structure and method for power devices that can overcome the deficiencies in the art.

SUMMARY

A power semiconductor device with contiguous gate trenches and offset source trenches, substantially as shown in and/or described in connection with at least one of the figures, and as set forth more completely in the claims.

BRIEF DESCRIPTION OF THE DRAWINGS

FIG. 1C illustrates a magnified view of a feature of FIG. 1B.

DETAILED DESCRIPTION

Figure 1A:
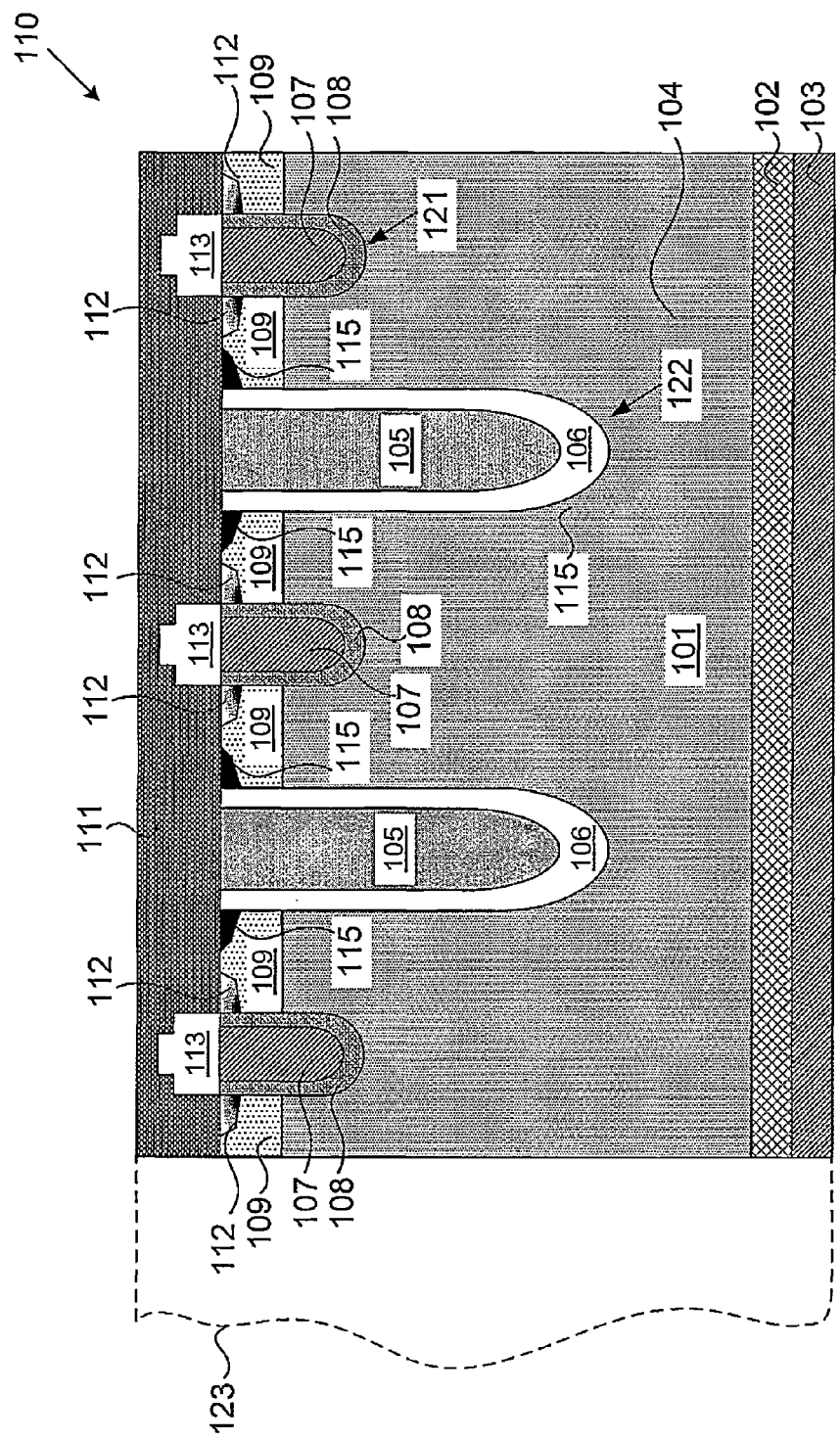
FIG. 1A illustrates a cross-sectional view of an embodiment of the present invention.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Referring to FIG. 1A, structure 110 corresponds to a cross section of an embodiment of the present invention. Structure 110 includes semiconductor substrate 101. Semiconductor substrate 101 can be, for example, an N type or a P type silicon substrate. Semiconductor substrate 101 includes drift region 104, drain region 102, and channel regions 109. Drift region 104 can include, for example, an epitaxial layer. Channel regions 109 and source regions 112 can be formed in the epitaxial layer, for example. Structure 110 includes drain contact 103 electrically connected to drain region 102. A suitable termination structure surrounds the semiconductor device, but is not shown in the drawings in order not to obscure the inventive concepts. It is noted that dashed lines 123 in FIG. 1A indicate that structure 110 extends beyond the cross-section specifically shown in the drawing.

Structure 110 includes a plurality of gate trenches, including gate trench 121. Although three gate trenches, including gate trench 121, are shown in FIG. 1A, there may be any number of gate trenches. Gate trench 121 extends from the top surface of semiconductor substrate 101 into semiconductor substrate 101. Gate trench 121 may include gate trench dielectric 108 and gate electrode 107. Gate trench dielectric 108 may include silicon oxide, for example, or other suitable dielectric materials. In some embodiments, gate trench dielectric 108 may be thicker on the bottom of gate trench 121 than on the sidewalls of gate trench 121. Gate electrode 107 may include doped polysilicon, for example. The gate electrodes are insulated from source contact 111 by gate insulators 113. For example, gate electrode 107 of gate trench 121 is electrically insulated from source contact 111 by gate insulator 113. Gate insulators 113 may include any suitable dielectric material.

Structure 110 includes a plurality of source trenches, including source trench 122. Although two source trenches, including source trench 122, are shown in FIG. 1A, there may be any number of source trenches. Source trench 122 extends from the top surface of semiconductor substrate 101 into semiconductor substrate 101. Source trench 122 may include source trench dielectric 106 and source electrode 105. Source trench dielectric 106 may include silicon oxide, for example, or other suitable dielectric materials. In some embodiments, source trench dielectric 106 may be thicker on the bottom of source trench 122 than on the sidewalls of source trench 122. Source electrode 105 may include doped polysilicon, for example. Source electrodes 105 are electrically connected to source regions 112 by source contact 111. Source contact 111 is electrically coupled to each source region 112. In the present embodiment, source contact 111 is the only source contact of structure 120 and may comprise a blanket layer. However, in some embodiments, there may be more than one source contact. Adjacent to each of the source trenches are shallow p+ regions. For example, source trench 122 is adjacent to shallow p+ region 115.

In the present embodiment, each of the plurality of gate trenches, including gate trench 121, are spaced to be substantially centered between each of the plurality of source trenches, including source trench 122. In the present embodiment, the plurality of source trenches are spaced to be substantially equally apart from one another. However, in some embodiments, the plurality of source trenches and the plurality of gate trenches may be spaced differently.

Figure 1B:
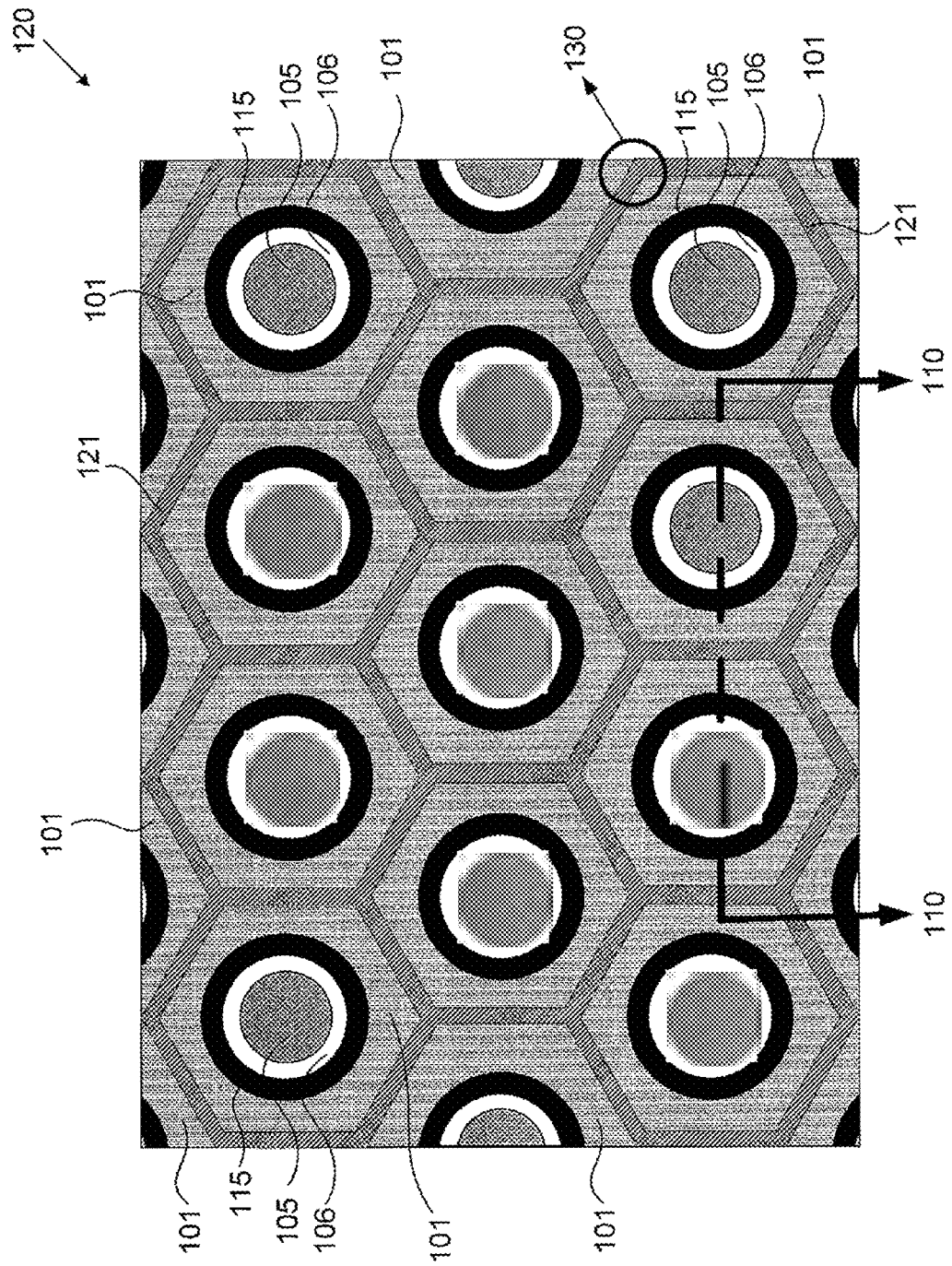
FIG. 1B illustrates a top view of an embodiment of the present invention.

Referring to FIG. 1B, structure 120 corresponds to a top view of an embodiment of the present invention. In FIG. 1B, cross-section 110 corresponds to the cross-section presented in FIG. 1A. Certain features of FIG. 1A have been left out of FIG. 1B to preserve clarity, such as source contact 111, gate insulators 113, source regions 112, and channel regions 109. Structure 120 includes semiconductor substrate 101. Semiconductor substrate 101 completely surrounds each of the plurality of source trenches.

Structure 120 includes a plurality of source trenches. The plurality of source trenches each include source electrode 105 and source trench dielectric 106, and are surrounded, near the top surface of the semiconductor structure as shown in the cross-sectional view in FIG. 1A, by shallow P+ region 115. Near the top surface of the semiconductor structure, shallow P+ region 115 may surround each of the plurality of source trenches, as depicted in structure 120. The plurality of source trenches are offset from one another, such that the plurality of source trenches are substantially equally spaced from each adjacent source trench. Although source electrodes 105 are shown to be substantially circular in the present embodiment, in some embodiments, source electrodes 105 may be another suitable shape.

Structure 120 includes a plurality of gate trenches, including gate trench 121. The plurality of gate trenches form hexagonal patterns and are contiguous throughout structure 120. For example, one of the hexagonal patterns can include six interconnected gate trenches. The contiguous hexagonal patterns of the plurality of gate trenches separate the plurality of source trenches from one another. Gate electrodes 107 of the plurality of gate trenches may be further coupled together at one or more sides of the semiconductor device. Although the plurality of gate trenches are shown to form contiguous hexagonal patterns, the plurality of gate trenches may also form circular patterns, or other suitable patterns. In structure 120, the plurality of gate trenches are shown as separating each horizontal row of the plurality of source trenches. However, in some embodiments, the plurality of gate trenches may separate every other row, every third row, or separate the plurality of source trenches in another similar suitable layout.

For ease of illustration, circled portion 130 of FIG. 1B is shown in an expanded form as structure 130 in FIG. 1C. Referring to FIG. 1C, structure 130 shows a magnified view of one segment of a gate trench of the plurality of gate trenches in FIG. 1B. Structure 130 includes gate electrode 107 and gate trench dielectric 108. Although gate electrode 107 and gate trench dielectric 108 are not illustrated in FIG. 1B, both features are present throughout the contiguous hexagonal patterns of the plurality of gate trenches.

The embodiment described above in relation to FIGS. 1A, 1B, and 1C offers several benefits and improved performance characteristics. For example, layout of the source trenches 122 can support a similar breakdown voltage as a semiconductor device having a parallel-stripe layout while occupying substantially less space in semiconductor substrate 101. Moreover, the specific resistance of the active area ("RAA") is improved and the ON resistance ($R_{dson}$) of the device is reduced. Additionally, the layout of the plurality of source trenches allow for drift region 104 to be highly doped which leads to a further improvement in the RAA of the semiconductor device by approximately 50%.

Further, as a result of the arrangement of the plurality of source trenches, approximately 50% less of semiconductor substrate 101 is consumed by the plurality of source trenches in comparison to devices utilizing a parallel-stripe layout. Therefore, it can be appreciated that a semiconductor device utilizing an embodiment of the present invention can have its die size reduced by approximately 50% compared to devices utilizing a parallel-stripe layout, while maintaining the same RAA and $R_{dson}$ and half the capacitance. Alternatively, a semiconductor device utilizing an embodiment of the present invention can maintain the same size die of devices utilizing a parallel-stripe layout while reducing the RAA and $R_{dson}$ of the device by approximately 50%.

The RAA contribution of channel region 109 in the present embodiment may be less than approximately 10%, for example. As a result, the gate density and gate charge can be adjusted with only a minimal impact on the RAA of the semiconductor device. Utilizing the layout described above generally creates a high gate density, which may be especially suitable for low voltage devices, for example, where a large percentage of RAA depends on gate density.

Figure 2:
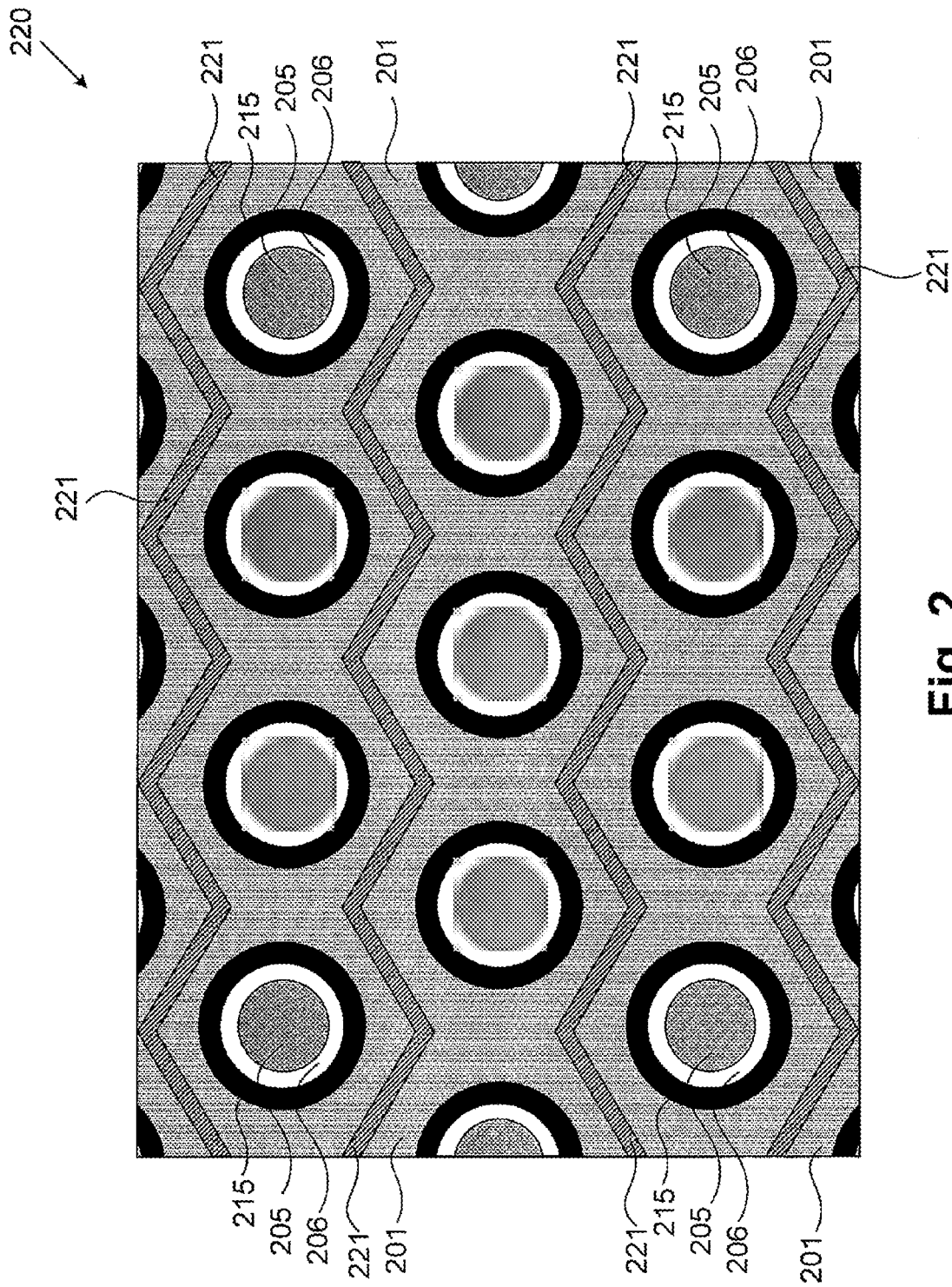
FIG. 2 illustrates a top view of an embodiment of the present invention.

Referring to FIG. 2, structure 220 corresponds to a top view of an embodiment of the present invention. Various features in FIG. 2 correspond to similarly numbered features in FIGS. 1A, 1B, and 1C. For example, semiconductor substrate 201 in FIG. 2 corresponds to semiconductor substrate 101 in FIGS. 1A and 1B. Certain features of FIG. 2 have been left out to preserve clarity, such as a source contact, a gate insulator, source regions, and channel regions.

Structure 220 includes semiconductor substrate 201. Semiconductor substrate 201 completely surrounds each of the plurality of source trenches in structure 220. The plurality of source trenches each include source electrode 205 and source trench dielectric 206, and are surrounded by shallow P+ region 215. Shallow P+ region 215 may surround each of the plurality of source trenches, as depicted in structure 220. The plurality of source trenches are offset from one another, such that the plurality of source trenches are substantially equally spaced from each adjacent source trench. Although source electrodes 205 are shown to be substantially circular in the present embodiment, in some embodiments, source electrodes 205 may be another suitable shape.

Structure 220 includes a plurality of gate trenches, including gate trench 221. The plurality of gate trenches form zigzag patterns and are contiguous throughout structure 220. For example, one segment of the zigzag patterns can include two interconnected gate trenches. The contiguous zigzag patterns of the plurality of gate trenches separate the plurality of source trenches from one another. Although the plurality of gate trenches are shown to form contiguous zigzag patterns, the plurality of gate trenches may also form straight line patterns, or other suitable patterns.

The embodiment described above in relation to FIG. 2 offers several benefits and improved performance characteristics. For example, shallow P+ region 215 can support a similar breakdown voltage as a semiconductor device having a parallel-stripe layout while occupying substantially less space in semiconductor substrate 201. Moreover, the specific resistance of the active area ("RAA") is improved and the ON resistance ($R_{dson}$) of the device is reduced. Additionally, the layout of the plurality of source trenches allow for the drift region to be highly doped which leads to a further improvement in the RAA of the semiconductor device by approximately 50%.

Moreover, as a result of the arrangement of the plurality of source trenches, approximately 50% less of semiconductor substrate 201 is utilized for the plurality of source trenches in comparison to devices utilizing a parallel-stripe layout. Therefore, it can be appreciated that a semiconductor device utilizing an embodiment of the present invention can have its die size reduced by approximately 50% compared to similar devices utilizing a parallel-stripe layout while maintaining the same RAA and $R_{dson}$ and half the capacitance. Alternatively, a semiconductor device utilizing an embodiment of the present invention can maintain the same size die of devices utilizing a parallel-stripe layout while reducing the RAA and $R_{dson}$ of the device by approximately 50%.

Additionally, structure 220 has a lower gate density which may be suitable for high voltage devices, where the lower gate density would create a small increase in $R_{dson}$ of the semiconductor device while significantly improving gate charge. As such, structure 220 has flexibility for adjusting gate density in order to tune the tradeoff between the $R_{dson}$ of the semiconductor device and the gate charge.

It is noted that while the drawings of the present embodiment have been discussed primarily in relation to a power MOSFET, the present inventive concepts apply to other semiconductor devices as well.

Figure 3:
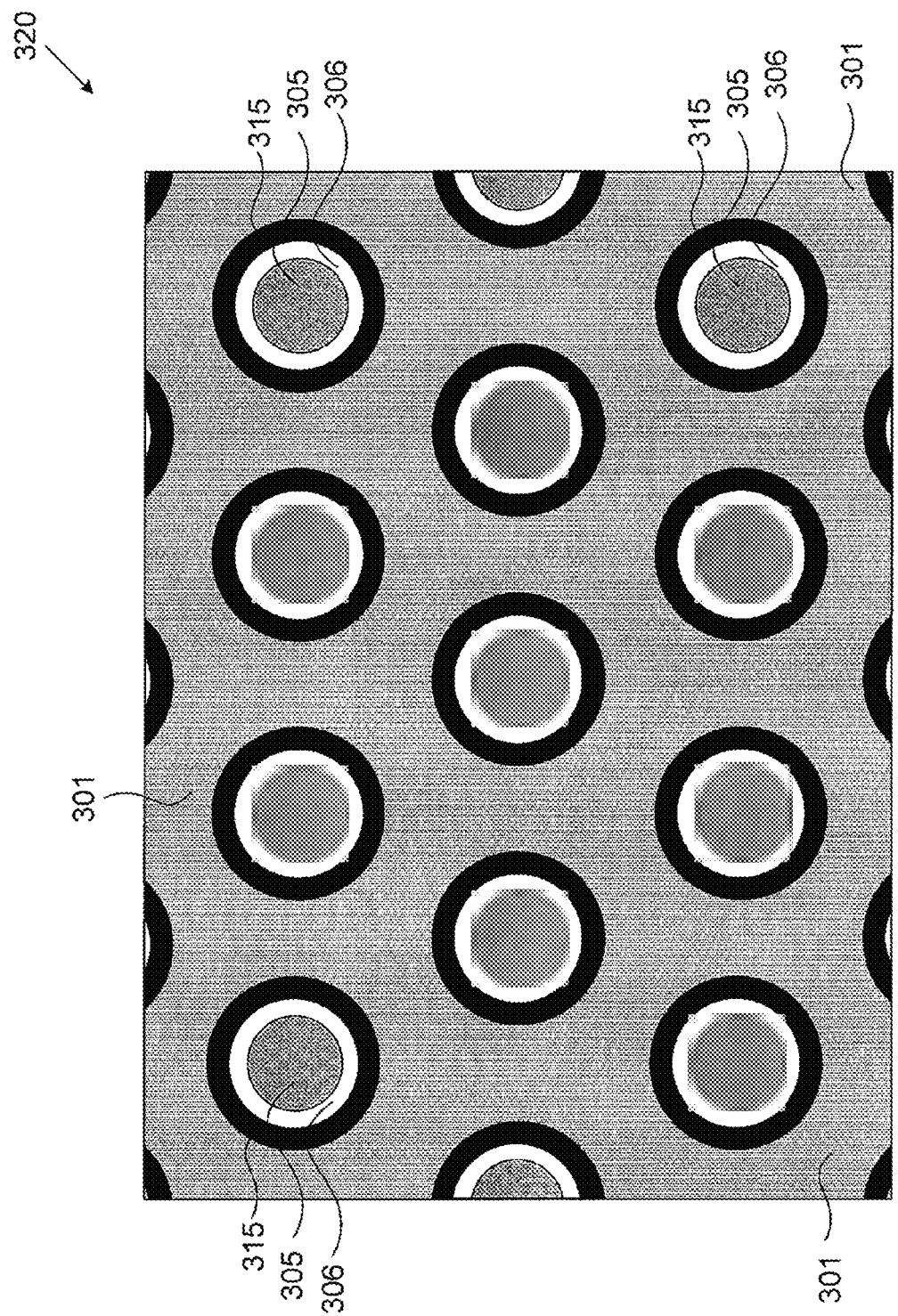
FIG. 3 illustrates a top view of an embodiment of the present invention.

Referring to FIG. 3, structure 320 corresponds to a top view of an embodiment of the present invention. Structure 320 includes a diode, and thus certain features depicted in FIGS. 1A, 1B, 1C, and 2 are not necessarily included. For example, structure 320 does not include gate trenches, gate electrodes, source regions, and other features associated with power semiconductor devices such as those described above in reference to FIGS. 1A, 1B, 1C, and 2.

Structure 320 includes semiconductor substrate 301. Semiconductor substrate 301 completely surrounds each of the plurality of shield electrode trenches in structure 320. The plurality of shield electrode trenches each include shield electrode 305 and shield electrode trench dielectric 306, and are surrounded by shallow P+ region 315. Shallow P+ region 315 may surround each of the plurality of shield electrode trenches, as depicted in structure 320. The plurality of shield electrode trenches are offset from one another, such that the plurality of shield electrode trenches are substantially equally spaced from each adjacent shield electrode trench. Although shield electrodes 305 are shown to be substantially circular in the present embodiment, in some embodiments, shield electrodes 305 may be another suitable shape.

The embodiment described above in relation to FIG. 3 offers benefits and improved performance characteristics. For example, the forward voltage drop of the device is improved as a result of the described shield electrode layout. For a given forward voltage the capacitance can be reduced by 50% which will reduce the diode reverse recovery losses.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor device comprising:
   a plurality of source trenches adjacent to a plurality of doped regions, wherein the plurality of source trenches extend from a top surface of a semiconductor substrate into the semiconductor substrate and are disposed along a plurality of rows;
   a source trench dielectric lining each of the plurality of source trenches, wherein the source trench dielectric is thicker on a bottom of the source trench than on sidewalls of the source trench;
   a plurality of source electrodes extending from the top surface of the semiconductor substrate, wherein each of the plurality of source electrodes is disposed in one of the plurality of source trenches;
   gate trenches extending from the top surface into the semiconductor substrate, wherein the gate trenches form zigzag patterns, wherein the gate trenches are arranged in a plurality of contiguous formations, wherein each of the plurality of contiguous formations is physically separate from one another, wherein the plurality of contiguous formations separate adjacent rows of the plurality of source trenches, and wherein the gate trenches do not completely surround each of the plurality of source trenches; and
   a plurality of source regions adjacent to the plurality of contiguous formations, wherein the plurality of source electrodes are electrically coupled to the plurality of source regions, and wherein the plurality of source regions have an opposite doping type as the plurality of doped regions and are physically separate from the plurality of doped regions.

2. The power semiconductor device of claim 1, wherein a source contact is electrically coupled to each of the plurality of source regions.

3. The power semiconductor device of claim 2, wherein each of the gate trenches is electrically insulated from the source contact by a corresponding gate insulator.

4. The power semiconductor device of claim 3, wherein each of the plurality of source electrodes comprises polysilicon, wherein the source contact comprises a metal, and wherein the source contact directly contacts each of the plurality of source electrodes and each of the plurality of source regions.

5. The power semiconductor device of claim 1, wherein a gate trench dielectric lines each of the gate trenches.

6. The power semiconductor device of claim 1, wherein the gate trenches are spaced substantially equally between adjacent source trenches.

7. The power semiconductor device of claim 1, wherein a drain region of the semiconductor substrate is electrically coupled to a drain contact.

8. The power semiconductor device of claim 1, wherein each row of the plurality of source trenches are offset from one another.

9. The power semiconductor device of claim 1, wherein each of the plurality of source trenches are substantially equally spaced from one another.

10. A power semiconductor device comprising:
    a plurality of source openings adjacent to a plurality of doped regions, each of the plurality of source openings including a substantially circular source trench electrode, and wherein the plurality of source openings extend from a top surface of a semiconductor substrate into the semiconductor substrate and are disposed along a plurality of rows;
    a source opening dielectric lining each of the plurality of source openings, wherein the source opening dielectric is thicker on a bottom of the source opening than on sidewalls of the source opening;

a plurality of source electrodes extending from the top surface of the semiconductor substrate, wherein each of the plurality of source electrodes is disposed in one of the plurality of source openings;

gate trenches extending from the top surface into the semiconductor substrate, wherein the gate trenches form zigzag patterns, wherein the gate trenches are arranged in a plurality of contiguous formations, wherein the plurality of contiguous formations are physically separate from one another, wherein the plurality of contiguous formations separate adjacent rows of the plurality of source openings, and wherein the gate trenches do not completely surround the plurality of source openings; and a plurality of source regions adjacent to the plurality of contiguous formations, wherein the plurality of source electrodes are electrically coupled to the plurality of source regions, wherein each of the plurality of source regions is aligned with one of the gate trenches forming the zigzag patterns.

11. The power semiconductor device of claim 10, wherein a source contact is electrically coupled to each of the plurality of source regions.

12. The power semiconductor device of claim 10, wherein each row of the plurality of source openings are offset from one another.

13. The power semiconductor device of claim 10, further comprising a shallow p+ region directly adjacent to each of the plurality of source openings.

14. A power semiconductor device comprising:

a plurality of channel regions disposed at a top surface of a semiconductor substrate;

a plurality of source trenches adjacent to a plurality of doped regions, wherein the plurality of source trenches extend from the top surface of the semiconductor substrate into the semiconductor substrate and are disposed along a plurality of rows;

a source trench dielectric lining each of the plurality of source trenches, wherein the source trench dielectric is thicker on a bottom of the source trench than on sidewalls of the source trench;

a plurality of source electrodes extending from the top surface of the semiconductor substrate, wherein each of the plurality of source electrodes is disposed in one of the plurality of source trenches;

gate trenches extending from the top surface into the semiconductor substrate, wherein the gate trenches are arranged in a plurality of contiguous formations, wherein the plurality of contiguous formations are physically separate from one another, wherein the plurality of contiguous formations separate adjacent rows of the plurality of source trenches, and wherein the gate trenches do not completely surround the plurality of source trenches; and a plurality of source regions adjacent to the plurality of contiguous formations, wherein the plurality of source electrodes are electrically coupled to the plurality of source regions, and wherein the plurality of source regions are physically separated from the plurality of doped regions by portions of the plurality of channel regions.

15. The power semiconductor device of claim 14, wherein the gate trenches form zigzag patterns.

16. The power semiconductor device of claim 14, further comprising a shallow p+ region adjacent to each of the plurality of source trenches.

* * * * *